United States Patent
Querbach et al.

(10) Patent No.: US 7,501,863 B2
(45) Date of Patent: Mar. 10, 2009

(54) VOLTAGE MARGINING WITH A LOW POWER, HIGH SPEED, INPUT OFFSET CANCELLING EQUALIZER

(75) Inventors: Bruce Querbach, Hillsboro, OR (US); Randall B. Hamilton, Hillsboro, OR (US); Luke A. Johnson, Queen Creek, AZ (US); Minyoung Kim, Mather, CA (US)

(73) Assignee: Intel Corporation, Santa Clara, CA (US)

( * ) Notice: Subject to any disclaimer, the term of this patent is extended or adjusted under 35 U.S.C. 154(b) by 16 days.

(21) Appl. No.: 11/724,128

(22) Filed: Mar. 14, 2007

(65) Prior Publication Data

US 2008/0231356 A1  Sep. 25, 2008

(51) Int. Cl.
*H03K 17/00* (2006.01)

(52) U.S. Cl. ............................ 327/94; 327/91

(58) Field of Classification Search ............... None
See application file for complete search history.

(56) References Cited

U.S. PATENT DOCUMENTS

| | | | | |
|---|---|---|---|---|
| 5,909,131 A | * | 6/1999 | Singer et al. | 327/91 |
| 6,909,391 B2 | * | 6/2005 | Rossi | 341/161 |
| 2007/0229046 A1 | | 10/2007 | Johnson et al. | |

* cited by examiner

*Primary Examiner*—Cassandra Cox
(74) *Attorney, Agent, or Firm*—Seth Z. Kalson

(57) ABSTRACT

A switched-capacitor circuit that may be used for equalization, but configurable for voltage margining. The switched-capacitor circuit cancels the offset voltage inherent in an amplifier and sets the common mode of an input signal at half the rail voltage. Two capacitors level shift an input signal before being applied to the two input ports of an amplifier. When used for voltage margining, the input voltage swing is reduced at the input ports of the amplifier by connecting a digital-to-analog controlled voltage source to the two capacitors.

4 Claims, 2 Drawing Sheets

US 7,501,863 B2

VOLTAGE MARGINING WITH A LOW POWER, HIGH SPEED, INPUT OFFSET CANCELLING EQUALIZER

FIELD

The present invention relates to analog circuits, and more particularly, to switched-capacitor circuits that may be used for voltage margining and equalization.

BACKGROUND

Voltage margining is a method for testing the ability of a transmitter or receiver to tolerate poor or marginal signal quality by purposely reducing the amplitude of voltage swings of an input signal. One approach to voltage margining is to use a high-speed tester. A tester should be able to generate a pattern of logical ones and zeros at high speed, such as for example at a speed of 6.4 GTS (Giga-Transfers-per-Second). The tester should also be able to adjust the amplitude of the input voltage swings. However, such a tester may be expensive.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Embodiments of the present invention provide voltage margining, and share components with an equalizer circuit that may be used in a receiver. As a result, a separate tester is not required if the equalizer circuit is already employed in the device to be tested. Making use of the components in the existing equalizer circuit is economically efficient.

The equalizer circuit is the subject of the patent application "Switched Capacitor Equalizer with Offset Voltage Canceling," by Luke A. Johnson and Yueming He, Ser. No. 11/396,393, filed Mar. 31, 2006, hereinafter referred to as "switched capacitor equalizer", and assigned to the same assignee as the present patent application.

Figure 1:
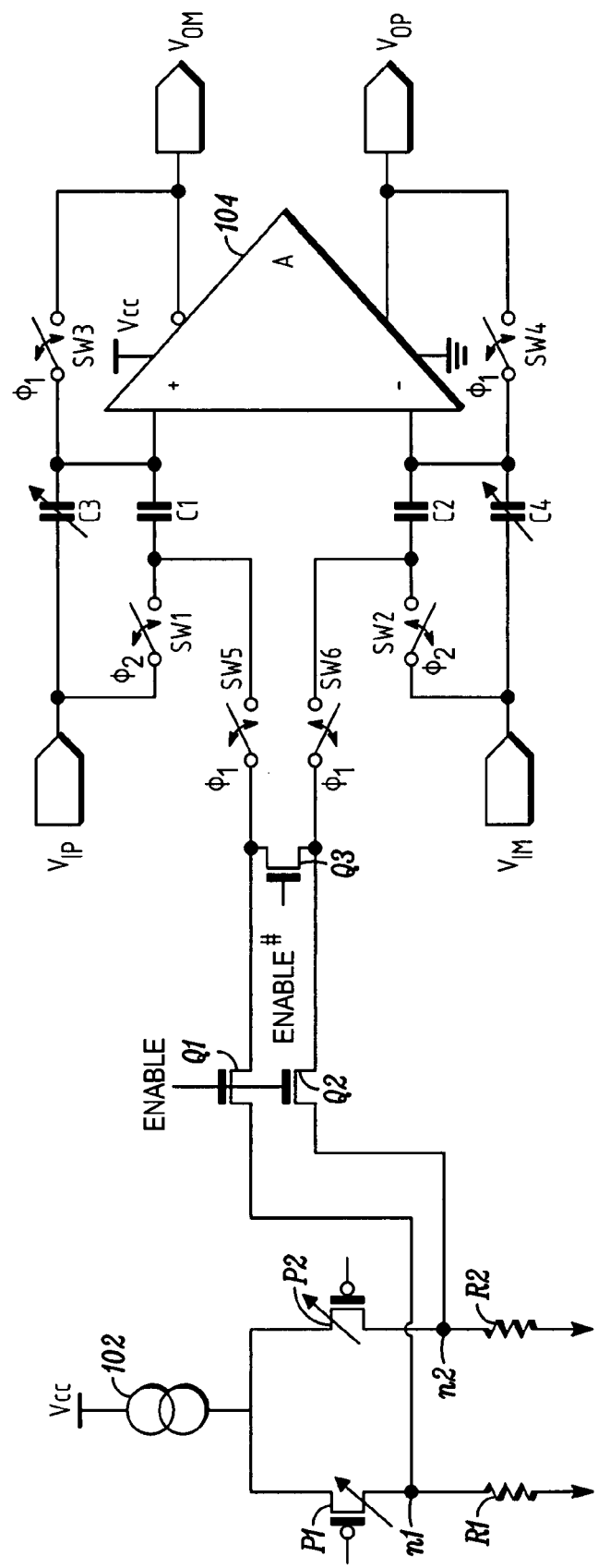
FIG. 1 illustrates a circuit according to an embodiment of the present invention.

A circuit according to an embodiment of the present invention is illustrated in FIG. 1. Some of the components in the circuit of FIG. 1 form an equalizer circuit, whereas other components come into play when an embodiment is used for voltage margining. For example, capacitors C3 and C4, illustrated with an arrow through their respective symbols, may be enabled or disabled. If the embodiment of FIG. 1 is used as an equalizer, capacitors C3 and C4 are enabled; whereas if the embodiment of FIG. 1 is used for voltage margining, capacitor C3 and C4 may be disabled.

An enable signal is indicated in FIG. 1, where the gate voltages of nMOSFETs (n-Metal Oxide Semiconductor Field Effect Transistor) Q1 and Q2 are HIGH if the enable signal is HIGH, and the gate voltage of nMOSFET Q3 is HIGH if the enable signal is LOW. Consequently, if the enable signal is HIGH, nMOSFET Q3 is OFF, and nMOSFETs Q1 and Q2 are HIGH, so that the voltage source comprising current source 102, pMOSFETs P1 and P2, and resistors R1 and R2 come into play. This voltage source is utilized when the embodiment of FIG. 1 is used for voltage margining. If the enable signal is LOW, nMOSFETs Q1 and Q2 are OFF, and nMOSFET Q3 is HIGH, so that the embodiment of FIG. 1 is configured as an equalizer and voltage margining is not enabled. Note that nMOSFETs Q1 and Q2 and Q3 each serve the function of a switch, and that embodiments may utilize other realizations of for a switch, such as for example a pass gate.

The voltage source comprising current source 102, pMOSFETs P1 and P2, and resistors R1 and R2, serves the function of a DAC-controlled (Digital-to-Analog Converter) voltage source. In the embodiment of FIG. 1, pMOSFET P1 represents a set of parallel-connected pMOSFETs, where the pMOSFETs that are active in the set of pMOSFETs P1 are controlled by set of control bits (voltages). By adjusting the number of active pMOSFETs in pMOSFET P1, the amount of current sourced into resistor R1 may be controlled, so that the voltage at node n1 may be controlled. This control is illustrated schematically by placement of an arrow through the symbol for pMOSFET P1. Similar remarks apply to pMOSFET P2, resistor R2, and node n2.

Although a description of the equalization function of the embodiment of FIG. 1 is not necessary to understand its voltage margining function, it is nevertheless pedagogically useful to describe how the embodiment of FIG. 1 is used as an equalizer with voltage offset canceling. The reference to a voltage offset refers to the voltage offset inherent in amplifier 104. When configured as an equalizer in which voltage margining is not performed, the enable signal in the embodiment of FIG. 1 is LOW so that nMOSFET Q3 is ON, as discussed earlier. In this way, capacitors C1 and C2 are connected to each other when switches SW5 and SW6 are closed.

Figure 2:
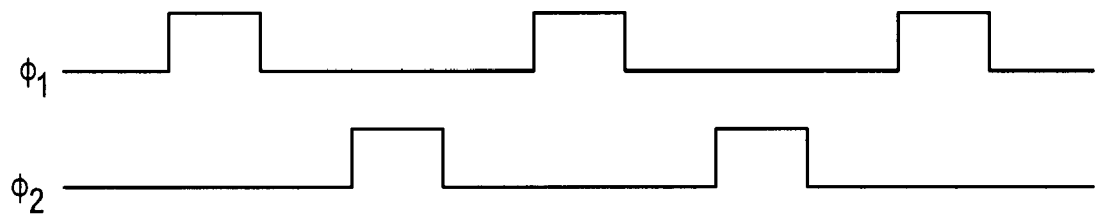
FIG. 2 illustrates a timing diagram for two clock signals used in the embodiment of FIG. 1.

Assume that amplifier 104 has an offset voltage $V_{OS}$, and let A denote the gain of amplifier 104. In the embodiment of FIG. 1, capacitors C1 and C2 are matched to each other to have the same capacitance, which we denote as $C_I$; and capacitors C3 and C4 are also matched to each other to have the same capacitance, which we denote as $C_E$. Switches SW3, SW4, SW5, and SW6 are controlled by clock signal $\phi_1$, and switches SW1 and SW2 are controlled by clock signal $\phi_2$. A switch is closed when its corresponding clock signal is HIGH, and is open otherwise. An example of the clock signals $\phi_1$ and $\phi_2$ is provided in FIG. 2.

Denoting the input voltages by $V_{IP}$ and $V_{IM}$ as indicated in FIG. 1, when clock signal $\phi_1$ is HIGH, the voltage drops across capacitors C1 and C2, denoted as $V_{C1}$ and $V_{C2}$, respectively, are such that for large gain A, $V_{C1}-V_{C2} \approx V_{OS}$. Also when clock signal $\phi_1$ is HIGH and the gain A is large, the voltage drops across capacitors C3 and C4, denoted as $V_{C3}$ and $V_{C4}$, respectively, are such that $V_{C3}-V_{C4} \approx V_{IM}-V_{IP}+V_{OS}$.

Suppose now that the clock signals transition so that clock signal $\phi_1$ goes LOW and clock signal $\phi_2$ goes HIGH. The input voltages $V_{IP}$ and $V_{IM}$ will, in general, change in value from what they were before the clock transition. To distinguish these new values, a time discrete time index n is introduced, so that we may represent the old input voltage values as $V_{IP}[n-1]$ and $V_{IM}[n-1]$ and the new voltage values as $V_{IP}[n]$ and $V_{IM}[n]$. This notation may be applied to the other voltages in the circuit. With this notation, we have before the clock transition the relationships $V_{C1}[n-1]-V_{C2}[n-1] \approx V_{OS}$ and $V_{C3}[n-1]-V_{C4}[n-1] \approx V_{IM}[n-1]-V_{IP}[n-1]+V_{OS}$. For the new clock transition, switches SW1 and SW2 close, and switches SW3, SW4, SW5, and SW6 open, and as a result there is, in general, a transfer of charge among capacitors C1 and C3 such that their voltage drops are equal to each other, and a transfer of charge among capacitors C2 and C4 so that their voltage drops are equal to each other.

The magnitude of the charge transferred among capacitors C1 and C3, denoted as $\Delta Q_{13}$, is $\Delta Q_{13}=|V_{C3}[n-1]-V_{C1}[n-1]|(C_E\|C_I)$, and the magnitude of the charge transferred among C2 and C4, denoted as $\Delta Q_{24}$, is $\Delta Q_{24}=|V_{C4}[n-1]-V_{C2}[n-1]|(C_E\|C_I)$ where $(C_E\|C_I)$ is the capacitance of capacitors C3 and C1 (or C4 and C2) in parallel. As a result of this charge transfer, the new voltage at the positive input port of amplifier 104 at time index n is $V_{IP}[n]+V_{C3}[n-1]-(V_{C3}[n-1]-V_{C1}[n-1])(C_E\|C_I)/C_E$, and the new voltage at the negative input port of amplifier 104 at time index n at is $V_{IM}[n]+V_{C4}[n-1]-(V_{C4}[n-1]-V_{C2}[n-1])(C_E\|C_I)/C_E$. If y[n] denotes the differential output voltage $y[n]=V_{OP}[n]-V_{OM}[n]$, and x[n] denotes the differential input voltage $x[n]=V_{IP}[n]-V_{IM}[n]$, then from the previous expressions for the voltages at the negative and positive input ports of amplifier 104 and the relationships $V_{C1}[n-1]-V_{C2}[n-1]\approx V_{OS}$ and $V_{C3}[n-1]-V_{C4}[n-1]\approx V_{IM}[n-1]-V_{IP}[n-1]+V_{OS}$, it follows that $$y[n]\approx 2A(x[n]-Kx[n-1]),$$

where the scalar multiplier K is given by $K=C_E/(C_E+C_I)$.

In the above displayed equation, the discrete-time analog output y[n] is readily identified as the sum of the output of a discrete-time differentiator and the output of a linear amplifier. The effective combination of a discrete-time differentiator with a linear amplifier results in an equalization filter, or equalizer. This equalizer may be employed to help mitigate the effects of intersymbol interference in a bandlimited channel, and may be used in many transmit pre-emphasis and de-emphasis schemes.

In practice, there are other circuit components that may be used in an equalizer circuit. For example, switches may be employed to cross-couple the output ports of amplifier 104 to its input ports so that after an evaluation of the signal, the output voltages of amplifier 104 are latched and driven to full rail. See, for example, the switched capacitor equalizer patent application. Furthermore, the equalizer circuit may be replicated, but where the clock signals are interchanged for the replica, so that the resulting combination of equalizer circuits may perform equalization on opposite clock phases.

In the above discussion, it was noted that for large amplifier gain A, $V_{C1}-V_{C2}\approx V_{OS}$. In a sense, capacitors C1 and C2 store the offset voltage, and the offset voltage is cancelled from the input voltage to amplifier 104. It may also be shown that because of charge sharing with other components in the circuit of FIG. 1, the voltages stored on capacitors C1 and C2 are such that they level shift the input voltages so that the differential input voltage applied to the input ports of amplifier 104 has a common mode voltage centered at Vcc/2, where Vcc is the supply or rail voltage applied to the circuit of FIG. 1.

The DAC-controlled voltage source comprising current source 102, pMOSFETs P1 and P2, and resistors R1 and R2, should be designed so that the voltages generated at nodes n1 and n2 also have the same common mode voltage as the differential input voltage applied to the $V_{IP}$ and $V_{IM}$ input ports.

As a result of the above discussion, when the circuit of FIG. 1 is not being used for voltage margining, the voltages stored on capacitors C1 and C2 provide for cancellation of the offset voltage, and level shift the input voltages $V_{IP}$ and $V_{IM}$ so as to have a common mode centered within the full rail swing of amplifier 104. However, when used for voltage margining, capacitors C1 and C2 are no longer connected to each other when switches SW5 and SW6 are closed, but instead, are connected to the DAC-controlled voltage source comprising current source 102, pMOSFETs P1 and P2, and resistors R1 and R2. During voltage margining, nMOSFETs Q1 and Q2 are ON, so that voltages are sourced to capacitors C1 and C2 when switches SW5 and SW6 are closed. Provided the resistances of resistors R1 and R2 are not too large, capacitors C1 and C2 are charged (and or discharged) sufficiently fast so that the source-drain currents of pMOSFETs P1 and P2 determine the voltages at nodes n1 and n2. By properly setting the voltages at nodes n1 and n2, voltage margining is provided, where the voltage difference applied to the input ports of amplifier 104 is less than that of the voltage difference of the input voltages $V_{IP}$ and $V_{IM}$.

This may be illustrated by considering a simple numerical example. Suppose Vcc is 1V and that the offset voltage is zero. Because of charge sharing, the common mode voltage 500 mV is placed on the input ports of amplifier 104. If the circuit is configured as an equalizer without voltage margining, then when switches SW5 and SW6 are closed; the voltage at the terminals of capacitors C1 and C2 coupled together via switches SW5 and SW6 is at 250 mV; the voltage drop across capacitor C1 is 250 mV (the voltage on the terminal of capacitor C1 connected to amplifier 104 is 250 mV higher than the other terminal of capacitor C1); and the voltage drop across capacitor C2 is 250 mV (the voltage on the terminal of capacitor C2 connected to amplifier 104 is 250 mV higher than the other terminal of capacitor C2). Suppose pMOSFETs P1 and P2 are set so that the steady state voltages at nodes n1 and n2 are set to 300 mV and 200 mV, respectively. When voltage margining is enabled so that nMOSFETs Q1 and Q2 are ON, and when switches SW5 and SW6 are closed (switches SW1 and SW2 are open), the voltage drop across capacitor C1 drops to 200 mV (the voltage on the terminal of capacitor C1 connected to amplifier 104 is 200 mV higher than the other terminal of capacitor C1), and the voltage drop across capacitor C2 rises to 300 mV (the voltage on the terminal of capacitor C2 connected to amplifier 104 is 300 mv higher than the other terminal of capacitor C2).

As a result, when the clock signal $\phi_1$ is LOW so that switches SW5 and SW6 (and switches SW3 and SW4) are now opened, and the clock signal $\phi_2$ is HIGH so that switches SW1 and SW2 are now closed, the differential voltage applied to the input ports of amplifier 104 is now 100 mV less than it would be if the voltage drops on capacitors C1 and C2 were each equal to 250 mv. That is, for example, if the voltage $V_{IM}$ is at 0 mV, and the voltage $V_{IP}$ is at 500 mV, then the voltage difference between the input ports of amplifier 104 is reduced to 400 mV instead of the 500 mV it would have been if no voltage margining were applied.

In this way, embodiments provided voltage margining to amplifier 104.

Various modifications may be made to the disclosed embodiments without departing from the scope of the invention as claimed below. For example, the voltages generated at node n1 and n2 need not be generated by a DAC-controlled current source, but analog-controlled current sources may also be utilized.

It is to be understood in these letters patent that the meaning of "A is connected to B", where A or B may be, for example, a node or device terminal, is that A and B are connected to each other so that the voltage potentials of A and B are substantially equal to each other. For example, A and B may be connected together by an interconnect (transmission line). In integrated circuit technology, the interconnect may be exceedingly short, comparable to the device dimension itself. For example, the gates of two transistors may be connected together by polysilicon, or copper interconnect, where the length of the polysilicon, or copper interconnect, is comparable to the gate lengths. As another example, A and B may be connected to each other by a switch, such as a transmission gate, so that their respective voltage potentials are substantially equal to each other when the switch is ON.

It is also to be understood in these letters patent that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

It is also to be understood in these letters patent that a "current source" may mean either a current source or a current sink. Similar remarks apply to similar phrases, such as, "to source current".

It is also to be understood in these letters patent that various circuit components and blocks, such as current mirrors, amplifiers, etc., may include switches so as to be switched in or out of a larger circuit, and yet such circuit components and blocks may still be considered connected to the larger circuit.

What is claimed is:

1. A circuit comprising:
   an amplifier comprising a first input port and a second input port;
   a first capacitor connected to first input port of the amplifier;
   a second capacitor connected to the second input port of the amplifier;
   a voltage source comprising:
      a current source;
      a first set of pMOSFETs connected to the current source;
      a second set of pMOSFETs connected to the current source;
      a first node connected to the first set of pMOSFETs and coupled to the first capacitor when the first switch is closed; and
      a second node connected to the second set of pMOSFETs and coupled to the second capacitor when the second switch is closed;
   a first switch to couple the first capacitor to the voltage source when closed; and
   a second switch to couple the second capacitor to the voltage source when closed.

2. The circuit as set forth in claim 1, further comprising:
   a first resistor connected to the first node; and
   a second resistor connected to the second node.

3. The circuit as set forth in claim 1, further comprising:
   a first input port;
   a third switch to couple the first input port to the first capacitor when closed;
   a second input port; and
   a fourth switch to couple the second input port to the second capacitor when closed.

4. The circuit as set forth in claim 3, further comprising:
   a first resistor connected to the first node; and
   a second resistor connected to the second node.

* * * * *